United States Patent
Erdogan-Haug et al.

(10) Patent No.: US 10,752,810 B2
(45) Date of Patent: Aug. 25, 2020

(54) ASSEMBLY LAYER FOR FLEXIBLE DISPLAY

(71) Applicant: 3M INNOVATIVE PROPERTIES COMPANY, St. Paul, MN (US)

(72) Inventors: Belma Erdogan-Haug, Woodbury, MN (US); Albert I. Everaerts, Tucson, AZ (US); David S. Hays, Woodbury, MN (US); David J. Kinning, Woodbury, MN (US); Maria A. Appeaning, St. Paul, MN (US); Jong-Seob Won, Gyeonggi-do (KR); Ross E. Behling, Woodbury, MN (US); Jason D. Clapper, Lino Lakes, MN (US); Marie Aloshyna ep Lesuffleur, Painted Post, NY (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 162 days.

(21) Appl. No.: 15/575,680

(22) PCT Filed: May 31, 2016

(86) PCT No.: PCT/US2016/035005
§ 371 (c)(1),
(2) Date: Nov. 20, 2017

(87) PCT Pub. No.: WO2016/196458
PCT Pub. Date: Dec. 8, 2016

(65) Prior Publication Data
US 2018/0291238 A1 Oct. 11, 2018

Related U.S. Application Data

(60) Provisional application No. 62/170,519, filed on Jun. 3, 2015.

(51) Int. Cl.
*C09J 7/38* (2018.01)
*B32B 7/12* (2006.01)
(Continued)

(52) U.S. Cl.
CPC .................. *C09J 7/38* (2018.01); *B32B 3/04* (2013.01); *B32B 7/12* (2013.01); *B32B 25/14* (2013.01); *B32B 25/20* (2013.01); *B32B 27/08* (2013.01); *B32B 27/283* (2013.01); *B32B 27/308* (2013.01); *B32B 27/32* (2013.01); *B32B 27/36* (2013.01); *B32B 27/40* (2013.01); *C08G 77/455* (2013.01); *C09J 7/10* (2018.01); *H01L 51/0097* (2013.01); *H01L 51/5246* (2013.01); *B32B 2250/02* (2013.01); *B32B 2250/24* (2013.01); *B32B 2255/26* (2013.01); *B32B 2274/00* (2013.01); *B32B 2307/412* (2013.01); *B32B 2307/542* (2013.01); *B32B 2307/546* (2013.01); *B32B 2307/548* (2013.01);
(Continued)

(58) Field of Classification Search
CPC ......... B32B 25/20; B32B 25/14; B32B 25/08; B32B 25/04; B32B 25/00; B32B 7/04; B32B 7/10; B32B 7/02; B32B 7/00; B32B 3/00; B32B 1/00; B32B 27/28; B32B 27/26; B32B 27/08; B32B 27/06; B32B 27/00; B32B 2250/40; B32B 2250/03; B32B 2250/05; B32B 2250/00; B32B 2307/548; B32B 2307/732; B32B 2307/546; B32B 2307/542; B32B 2307/51; B32B 2307/50; B32B 2307/412; B32B 2307/40; B32B 2251/00; B32B 2457/20; B32B 2457/00; B32B 1/27; B32B 1/28; B32B 1/26; B32B 1/08; B32B 1/06; B32B 2250/2307; B32B 2250/548; B32B 2250/732; B32B 2250/546; B32B 2250/542; B32B 2250/51
See application file for complete search history.

(56) References Cited

U.S. PATENT DOCUMENTS 2,676,182 A 4/1954 Daudt
3,627,851 A 12/1971 Brady
(Continued)

FOREIGN PATENT DOCUMENTS

| CN | 102816551 | | 12/2012 |
|----|-----------|---|---------|
| EP | 2578655 | | 4/2013 |
| EP | 2815880 | | 12/2014 |
| EP | 3057163 | | 8/2016 |
| JP | 2000-160127 | A † | 6/2000 |
| JP | 2007-197517 | A † | 8/2007 |
| JP | 2009-299007 | | 5/2008 |
| JP | 2014012784 | | 1/2014 |
| JP | 2014152225 | | 8/2014 |

(Continued)

OTHER PUBLICATIONS

Encyclopedia of Polymer Science and Engineering, John Wiley & Sons, New York, 265-270 (1989).
(Continued)

*Primary Examiner* — Robert S Jones
(74) *Attorney, Agent, or Firm* — 3M Innovative Properties Compa

(57) ABSTRACT

The present invention is an assembly layer for a flexible device. Within a temperature range of between about −30° C. to about 90° C., the assembly layer has a shear storage modulus at a frequency of 1 Hz that does not exceed about 2 MPa, a shear creep compliance (J) of at least about $6 \times 10^{-6}$ l/Pa measured at 5 seconds with an applied shear stress between about 50 kPa and about 500 kPa, and a strain recovery of at least about 50% at at least one point of applied shear stress within the range of about 5 kPa to about 500 kPa within about 1 minute after removing the applied shear stress.

16 Claims, No Drawings

(51) Int. Cl.
  *B32B 27/40* (2006.01)
  *B32B 27/36* (2006.01)
  *C09J 7/10* (2018.01)
  *B32B 25/14* (2006.01)
  *B32B 27/30* (2006.01)
  *B32B 3/04* (2006.01)
  *B32B 27/32* (2006.01)
  *B32B 27/08* (2006.01)
  *B32B 25/20* (2006.01)
  *B32B 27/28* (2006.01)
  *C08G 77/455* (2006.01)
  *H01L 51/00* (2006.01)
  *H01L 51/52* (2006.01)

(52) U.S. Cl.
  CPC ....... *B32B 2457/12* (2013.01); *B32B 2457/20* (2013.01); *C09J 2201/622* (2013.01); *C09J 2203/318* (2013.01); *C09J 2409/00* (2013.01); *C09J 2423/00* (2013.01); *C09J 2433/00* (2013.01); *C09J 2453/00* (2013.01); *C09J 2475/00* (2013.01); *C09J 2483/00* (2013.01); *H01L 2251/5338* (2013.01)

(56) References Cited

U.S. PATENT DOCUMENTS

| | | |
|---|---|---|
| 3,772,247 A | 11/1973 | Flannigan |
| 3,890,269 A | 6/1975 | Martin |
| 4,619,979 A | 10/1986 | Kotnour |
| 4,661,577 A | 4/1987 | Jo Lane |
| 4,707,531 A | 11/1987 | Shirahata |
| 4,774,310 A | 9/1988 | Butler |
| 4,843,134 A | 6/1989 | Kotnour |
| 4,935,484 A | 6/1990 | Wolfgruber |
| 5,026,890 A | 6/1991 | Webb |
| 5,110,890 A | 5/1992 | Butler |
| 5,214,114 A | 5/1993 | Takahashi |
| 5,214,119 A | 5/1993 | Leir |
| 5,248,739 A | 9/1993 | Schmidt |
| 5,262,558 A | 11/1993 | Kobayashi |
| 5,276,122 A | 1/1994 | Aoki |
| 5,302,685 A | 4/1994 | Tsumura |
| 5,319,040 A | 6/1994 | Wengrovius |
| 5,461,134 A | 10/1995 | Leir |
| 5,512,650 A | 4/1996 | Leir |
| 5,514,730 A | 5/1996 | Mazurek |
| 5,637,646 A | 6/1997 | Ellis |
| 5,804,610 A | 9/1998 | Hamer |
| 5,866,222 A | 2/1999 | Seth |
| 5,907,018 A | 5/1999 | Mazurek |
| 6,166,110 A † | 12/2000 | Bredahl |
| 6,355,759 B1 | 3/2002 | Sherman |
| 6,407,195 B2 | 6/2002 | Sherman |
| 6,441,118 B2 | 8/2002 | Sherman |
| 6,531,620 B2 | 3/2003 | Brader |
| 6,664,359 B1 | 12/2003 | Kangas |
| 6,846,893 B1 | 1/2005 | Sherman |
| 7,084,209 B2 | 8/2006 | Everaerts |
| 7,153,924 B2 | 12/2006 | Kuepfer |
| 7,371,464 B2 | 5/2008 | Sherman |
| 7,494,708 B2 | 2/2009 | Everaerts |
| 7,501,184 B2 | 3/2009 | Leir |
| 8,137,807 B2 | 3/2012 | Clapper |
| 8,232,350 B2 | 7/2012 | Fujita |
| 8,541,481 B2 | 9/2013 | Determan |
| 8,551,616 B2 | 10/2013 | Joseph |
| 8,765,881 B2 | 7/2014 | Hays |
| 9,399,724 B2 | 7/2016 | Lewandowski |
| 2006/0024521 A1 | 2/2006 | Everaerts |
| 2007/0148475 A1 | 6/2007 | Sherman |
| 2009/0026934 A1 † | 1/2009 | Fujita |
| 2011/0134623 A1* | 6/2011 | Sherman ............... G02B 6/005 362/19 |
| 2012/0094037 A1 | 4/2012 | Banba |
| 2013/0070468 A1 | 3/2013 | Kuepper |
| 2013/0260149 A1 | 10/2013 | Clapper |
| 2014/0065389 A1 | 3/2014 | Loy |
| 2014/0295150 A1 | 10/2014 | Bower |
| 2014/0367644 A1 | 12/2014 | Song |
| 2015/0346408 A1 | 12/2015 | Mizutani |
| 2018/0126706 A1* | 5/2018 | Erdogan-Haug ......... B32B 7/00 |

FOREIGN PATENT DOCUMENTS

| | | |
|---|---|---|
| JP | 2015016653 | 1/2015 |
| JP | 2015017207 | 1/2015 |
| WO | WO 1997-40103 | 10/1997 |
| WO | WO 2009-111433 | 9/2009 |
| WO | WO 2009/154138 | 12/2009 |
| WO | WO 2010-147047 | 12/2010 |
| WO | WO 2011/162932 | 5/2011 |
| WO | WO 2012-112856 | 8/2012 |
| WO | WO 2014-091863 | 6/2014 |
| WO | WO 2014-130507 | 8/2014 |
| WO | WO 2015-053304 | 4/2015 |
| WO | WO 2016-196460 | 12/2016 |
| WO | WO 2016-196541 | 12/2016 |
| WO | WO 2016-196576 | 12/2016 |

OTHER PUBLICATIONS

"Thermal Transitions of Homopolymers: Glass Transition & Melting Point", Polymer Products from Aldrich, [retrieved from the internet on Jan. 12, 2018], URL <https://www3.nd.edu/~hgao/thermal_transitions_of_homopolymers.pdf>, pp. 52-53, XP55117588A.
International Search Report for PCT International Application No. PCT/US2016/035005, dated Jan. 2, 2017, 10pgs.

\* cited by examiner
† cited by third party

ASSEMBLY LAYER FOR FLEXIBLE DISPLAY

FIELD OF THE INVENTION

The present invention is related generally to the field of assembly layers. In particular, the present invention is related to flexible assembly layers used in flexible devices, such as flexible electronic displays and flexible photovoltaic materials.

BACKGROUND

A common application of pressure-sensitive adhesives in the industry today is in the manufacturing of various displays, such as computer monitors, TVs, cell phones and small displays (in cars, appliances, wearables, electronic equipment, etc.). Flexible electronic displays, where the display can be bent freely without cracking or breaking, is a rapidly emerging technology area for making electronic devices using, for example, flexible plastic substrates. This technology allows integration of electronic functionality into non-planar objects, conformity to desired design, and flexibility during use that can give rise to a multitude of new applications.

With the emergence of flexible electronic displays, there is an increasing demand for adhesives, and particularly for optically clear adhesives (OCA), to serve as an assembly layer or gap filling layer between an outer cover lens or sheet (based on glass, PET, PC, PMMA, polyimide, PEN, cyclic olefin copolymer, etc.) and an underlying display module of electronic display assemblies. The presence of the OCA improves the performance of the display by increasing brightness and contrast, while also providing structural support to the assembly. In a flexible assembly, the OCA will also serve at the assembly layer, which in addition to the typical OCA functions, may also absorb most of the folding induced stress to prevent damage to the fragile components of the display panel and protect the electronic components from breaking under the stress of folding. The OCA layer may also be used to position and retain the neutral bending axis at or at least near the fragile components of the display, such as for example the barrier layers, the driving electrodes, or the thin film transistors of an organic light emitting display (OLED).

If used outside of the viewing area of a display or photo-active area of a photovoltaic assembly, it is not necessary that the flexible assembly layer is optically clear. Indeed, such material may still be useful for example as a sealant at the periphery of the assembly to allow movement of the substrates while maintaining sufficient adhesion to seal the device.

Typical OCAs are visco-elastic in nature and are meant to provide durability under a range of environmental exposure conditions and high frequency loading. In such cases, a high level of adhesion and some balance of visco-elastic property is maintained to achieve good pressure-sensitive behavior and incorporate damping properties in the OCA. However, these properties are not fully sufficient to enable foldable or durable displays.

Due to the significantly different mechanical requirements for flexible display assemblies, there is a need to develop novel adhesives for application in this new technology area. Along with conventional performance attributes, such as optical clarity, adhesion, and durability, these OCAs need to meet a new challenging set of requirements such as bendability and recoverability without defects and delamination.

SUMMARY

In one embodiment, the present invention is an assembly layer for a flexible device. Within a temperature range of between about −30° C. to about 90° C., the assembly layer has a shear storage modulus at a frequency of 1 Hz that does not exceed about 2 MPa, a shear creep compliance (J) of at least about $6 \times 10^{-6}$/Pa measured at 5 seconds with an applied shear stress between about 50 kPa and about 500 kPa, and a strain recovery of at least about 50% at at least one point of applied shear stress within the range of about 5 kPa to about 500 kPa within about 1 minute after removing the applied shear stress.

In another embodiment, the present invention is a laminate including a first flexible substrate, a second flexible substrate, and an assembly layer positioned between and in contact with the first flexible substrate and the second flexible substrate. Within a temperature range of between about −30° C. to about 90° C., the assembly layer has a shear storage modulus at a frequency of 1 Hz that does not exceed about 2 MPa, a shear creep compliance (J) of at least about $6 \times 10^{-6}$/Pa measured at 5 seconds with an applied shear stress between about 50 kPa and about 500 kPa, and a strain recovery of at least about 50% at at least one point of applied shear stress within the range of about 5 kPa to about 500 kPa within about 1 minute after removing the applied shear stress.

In yet another embodiment, the present invention is a method of adhering a first substrate and a second substrate, wherein both of the first and the second substrates are flexible. The method includes positioning an assembly layer between the first substrate and the second substrate and applying pressure and/or heat to form a laminate. Within a temperature range of between about −30° C. to about 90° C., the assembly layer has a shear storage modulus at a frequency of 1 Hz that does not exceed about 2 MPa, a shear creep compliance (J) of at least about $6 \times 10^{-6}$/Pa measured at 5 seconds with an applied shear stress within about 50 kPa and about 500 kPa, and a strain recovery of at least about 50% at at least one point of applied shear stress within the range of about 5 kPa to about 500 kPa within about 1 minute after removing the applied shear stress.

DETAILED DESCRIPTION

The present invention is an assembly layer usable, for example, in a flexible devices, such as electronic displays, flexible photovoltaic cells or solar panels, and wearable electronics. As used herein, the term "assembly layer" refers to a layer that possesses the following properties: (1) adherence to at least two flexible substrates and (2) sufficient ability to hold onto the adherends during repeated flexing to pass the durability testing. As used herein, a "flexible device" is defined as a device that can undergo repeated flexing or roll up action with a bend radius as low as 200 mm, 100 mm, 50 mm, 20 mm, 10 mm, 5 mm, or even less than 2 mm. The assembly layer is soft, is predominantly elastic with good adhesion to plastic films or other flexible substrates like glass, and has high tolerance for shear loading. In addition, the assembly layer has relatively low modulus, high percent compliance at moderate stress, a low glass transition temperature, generation of minimal peak stress during folding, and good strain recovery after applying and removing stress, making it suitable for use in a flexible assembly because of its ability to withstand repeated folding and unfolding. Under repeated flexing or rolling of a multi-layered construction, the shear loading on the adhesive layers becomes very significant and any form of stress can cause not only mechanical defects (delamination, buckling of one or more layers, cavitation bubbles in the adhesive, etc.) but also optical defects or Mura. Unlike traditional adhesives that are mainly visco-elastic in character, the assembly layer of the present invention is predominantly elastic at use conditions, yet maintains sufficient adhesion to pass a range of durability requirements. In one embodiment, the assembly layer is optically clear and exhibits low haze, high visible light transparency, anti-whitening behavior, and environmental durability.

The assembly layer of the present invention is prepared from select compositions and cross-linked at different levels to offer a range of elastic properties, while still generally meeting all optically clear requirements. For example, an assembly layer used within a laminate with a folding radius as low as 5 mm or less can be obtained without causing delamination or buckling of the laminate or bubbling of the adhesive. Examples of suitable assembly layers compositions include at least one of, but are not limited to: an acrylic, an acrylic block copolymer, a physically cross-linked silicone elastomer, a covalently cross-linked silicone elastomer, an ionomerically cross-linked silicone elastomer reagent forming mixture, a polyurethane, a covalently crosslinked polyurethane comprising silicone-based moieties, a polyisoprene, a polybutadiene, an olefin block copolymer, a polyisobutylene, and a high alkyl polyolefin.

In one embodiment, the assembly layer composition is acrylic-based and is derived from precursors that include at least one alkyl(meth)acrylate ester having between about 1 to about 24 carbon atoms in the alkyl group and a free-radical generating initiator. In some embodiments, the precursor mixture includes a polar copolymerizable monomer and a cross-linker.

In one embodiment, the assembly layer composition is acrylic block copolymer-based. As used herein, the term "acrylic" is synonymous with "(meth)acrylate" and refers to polymeric material that is prepared from acrylates, methacrylates, or derivatives thereof. As used herein, the term "polymer" refers to a polymeric material that is a homopolymer or a copolymer. As used herein, the term "homopolymer" refers to a polymeric material that is the reaction product of one monomer. As used herein, the term "copolymer" refers to a polymeric material that is the reaction product of at least two different monomers. As used herein, the term "block copolymer" refers to a copolymer formed by covalently bonding at least two different polymeric blocks to each other, but that does not have a comb-like structure. The two different polymeric blocks are referred to as the A block and the B block.

In one embodiment, the assembly layer of the present invention includes at least one multi-block copolymer (for example, ABA or star block (AB)n where n represents the number of arms in the star block) and an optional diblock (AB) copolymer. Such block copolymers are physically cross-linked due to the phase separation of a hard A block and a soft B block. Additional cross-linking may be introduced by a covalent crosslinking mechanism (i.e. thermally induced or using UV irradiation, high energy irradiation such as e-beam, or ionic crosslinking). This additional cross-linking can be done in the hard block A, the soft block B, or both. In another embodiment, the acrylic block copolymer assembly layer is based on at least one multi-block copolymer, having, for example, a poly methyl methacrylate (PMMA) hard A blocks and one or more poly-n-butyl acrylate (PnBA) soft B blocks. In yet another embodiment, the acrylic block copolymer-based assembly layer is based on at least one multi-block copolymer, having, for example, a polymethyl methacrylate (PMMA) hard A blocks and one or more poly-n-butyl acrylate (PnBA) soft B blocks, combined with at least one AB diblock copolymer, having, for example, a poly methyl methacrylate (PMMA) hard A block and a poly-n-butyl acrylate (PnBA) soft B block.

The assembly layer contains a block copolymer that includes the reaction product of at least two A block polymeric units and at least one B block polymeric unit (i.e., at least two A block polymeric units are covalently bonded to at least one B block polymeric unit). Each A block, which has a Tg of at least 50° C., is the reaction product of a first monomer composition that contains an alkyl methacrylate, an aralkyl methacrylate, an aryl methacrylate, or a combination thereof. The A block may also be made from styrenic monomers, such as styrene. The B block, which has a Tg no greater than about 10° C., particularly no greater than about 0° C., and more particularly no greater than about −10° C., is the reaction product of a second monomer composition that contains an alkyl (meth)acrylate, a heteroalkyl (meth) acrylate, a vinyl ester, or a combination thereof. The block copolymer contains between about 5 and about 50 weight percent A block and between about 50 to about 95 weight percent B block based on the weight of the block copolymer.

In one embodiment, the assembly layer composition is silicone-based and includes at least one of physically cross-linked silicone elastomers, covalently cross-linked silicone elastomers and ionomerically cross-linked silicone elastomers. Suitable silicone elastomeric polymers include for example, urea-based silicone copolymers, oxamide-based silicone copolymers, amide-based silicone copolymers, urethane-based silicone copolymers, and mixtures thereof. Suitable covalently cross-linked silicones include those derived from silicone elastomer forming reagents that undergo for example condensation curing, addition curing, and thiol-ene type reaction. The term "silicone-based" as used herein refers to macromolecules (e.g., polymer of copolymer) that contain a majority of silicone units. The terms silicone or siloxane are used interchangeably and refer to units with a siloxane ($—Si(R_1)_2O—$) repeating units where $R_1$ is defined below. In many embodiments, $R_1$ is an alkyl. In some embodiments, the assembly layer includes a MQ resin. For urethane-based silicone copolymers, crosslinking may be achieved by addition curing, for example by photo-cross-linking of (meth)acrylate functional groups comprising the urethane-based silicone copolymers. Also, for urethane-based silicone copolymers, crosslinking may be achieved by condensation curing, for example by reaction of carboxylic acid groups comprising the urethane-based silicone copolymers curing with polyaziridines or carbodiimides. Multivalent metal ions, such as those based on zinc, aluminum, titanium, and the like may also be used in combination with an acid group containing urethane-based silicone copolymer to generate an ionomeric crosslinked network. The urethane-based silicone copolymers may also contain ionic functional groups such as sulfonate groups ($—SO_3\text{-M+}$), wherein M is Na or Li. The urethane-based silicone copolymers may also contain ionic functional groups such as quaternary ammonium salts ($—N(R_5)_3\text{+X}—$), wherein $R_5$ is independently alkyl, aryl, aralkyl, alkaryl, alkylene, arylene, aralkylene, or alkarylene, and X— is a counterion. The counterion may be for example a halide (Cl—, Br—, etc.) or a sulfonate ($R_6SO_3—$) wherein $R_6$ is alkyl, aryl, aralkyl, or alkaryl. These urethane-based silicone copolymers may be prepared using diisocyanates, carbinol capped silicone-based polyols, and other polyols. These polyurethanes may comprise units of the following formulas:

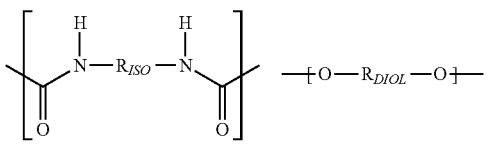

wherein $R_{ISO}$ is the residue of a diisocyanate and $R_{DIOL}$ is the residue of a diol, wherein $R_{DIOL}$ comprises units of the formula,
a) —$R_2$—,
  wherein $R_2$ is a straight, branched chain, or cyclic alkylene or oxyalkylene,
b) silicone-based units of the formula -Q-$(R_1)_2$SiO—(Si$(R_1)_2$O)$_n$—Si$(R_1)_2$-Q-,
  wherein $R_1$ is independently alkyl or aryl and wherein Q is a connecting group of valency 2 or greater, and n=5-200,
  and at least one of the units c), d), e), and f) wherein
c) acrylate containing units of the formula —$R_2$-(A)$_b$-Q-(A)$_b$-$R_2$—,
  and A is a (meth)acryl functional group X—C(O)C($R_4$)=CH$_2$,
    wherein X is selected from O—, or N$R_3$,
    wherein $R_3$ is H or alkyl of 1-4 carbon atoms,
    wherein $R_4$ is alkyl of 1-4 carbon atoms, and
    wherein b is 1-3, and Q and $R_2$ are defined as above,
d) carboxylic acid containing units of the formula —$R_2$-Q-(CO$_2$H)$_b$—$R_2$—, wherein —$R_2$—, b, and Q, are defined as above and
e) sulfonate acid salt containing units of the formula —$R_2$-Q-(SO$_3$M)$_b$-$R_2$—, wherein —$R_2$—, b, and Q, are defined as above and M is Na or Li,
f) quaternary ammonium salts units of the formula —$R_2$-Q-(N($R_5$)$_3$+X—)$_b$—$R_2$—, wherein —$R_2$—, b, and Q, are defined as above and $R_5$ is independently alkyl, aryl, aralkyl, alkaryl, alkylene, arylene, aralkylene, or alkarylene, and X— is a counterion.

The n in formula -Q-$(R_1)_2$SiO—(Si$(R_1)_2$O)$_n$—Si$(R_1)_2$-Q- is 5-200, particularly 10-100, and more particularly 15-75.

Q can be a straight or branched chain or cycle-containing connecting group. Q can include a covalent bond, an alkylene, an arylene, an aralkylene, an alkarylene. Q can optionally include heteroatoms such as O, N, and S, and combinations thereof. Q can also optionally include a heteroatom-containing functional groups such as hydroxyl, carbonyl or sulfonyl, and combinations thereof.

Examples of diisocyanates include isophorone diisocyanate 1,6-hexamethylene diisocyanate, 4,4'-methylenebis(cyclohexyl isocyanate), mixtures of 2,2,4-trimethyl-1,6-hexamethylene diiisocyanate and 2,4,4-trimethyl-1,6-hexamethylene diiisocyanate available from Evonik as Vestanat TMDI. Small amounts of polyisocyanates with functionality of greater that 2 may also be used. Many of the multifunctional isocyanates of greater than 2 functionality exist as a distribution of materials. For example, hexamethylene diisocyanate based isocyanate oligomers such as biuret multi-isocyanates, which are available under the trade designation DESMODUR N100, exist as a mixture of hexamethylene diisocyanate, hexamethylene diisocyanate biuret trimers, hexamethylene diisocyanate biuret pentamers, hexamethylene diisocyanate biuret heptamers, and so on. The same is true for hexamethylene diisocyanate based isocyanurate multi-isocyanates available under the trade designation DESMODUR N3300. Biuret and isocyanurate multi-isocyanates may be based on other diisocyanates such as isophorone diisocyanate, or tolylene diisocyanate.

Examples of the diols include 1,2-ethylene glycol, 1,4-butanediol, and the like. Additionally, a small amount of the diols may be replaced with hydrazine, or diamines. Silicone-based diols include Dow Corning dimethylsiloxane dicarbinol 5562, and Gelest dimethylsiloxane dicarbinol, DMS-C21. Acrylated diols include Epoxy Acrylate diol Denacol DA-920, polypropylene glycol (3) diglycidyl ether reacted with two moles of acrylic acid. Acid functional diols include 2,2-dimethylol-propanoic acid. Small amounts of polyols of functionality greater than 2 such as glycerol and polycaprolactone triols may be used.

In one embodiment, the assembly layer composition is based on a polyurethane. Such polyurethanes may be derived from a polyester polyol or polyetherpolyol reacted with a multifunctional isocyanate. In view of the lower modulus and lower Tg, polyether polyol based polyurethanes may be preferred, although some copolymerization with a polyester polyol is possible to tune the mechanical properties of the polymer. The polyurethanes may be sufficiently tacky to adhere reliably to the flexible substrates, but their adhesion and modulus can be further enhanced by using tackifiers and plasticizers as part of the formulation. These tackifiers and plasticizers are typically reducing the modulus of the polyurethane and they do not interfere with the physical crosslinking provided by the hard segments in the polyurethane polymer. If desired, the polyurethanes can also be covalently crosslinked, such as for example using polyurethanes with acrylate functionality, silane functionality, and the like.

In one embodiment the assembly layer composition is based on a diene, such as a polyisoprene or polybutadiene. Examples of such dienes include liquid isoprene and butadiene diol or isoprene diol. Liquid isoprene may be crosslinked using multifunctional thiol reagents which in the presence of a catalyst and heat or actinic irradiation will yield a predominantly elastic assembly layer material. The butadiene diol or isoprene diol can be used as the main polyol in a polyurethane polymer or they may be acrylate functionalized to allow for free-radical induced crosslinking or copolymerization with other acrylates or methacrylates to yield the assembly layer. If desired the modulus and adhesion of the diene based assembly layer can be adjusted by using tackifiers and/or plasticizers as part of the assembly layer formulation.

In one embodiment the assembly layer is based on an olefin polymer, such as an olefin block copolymer, a polyisobutylene, and a high alkyl polyolefin. An example of an olefin blockcopolymer is Infuse™ available from Dow Chemical, Midland, Mich. Such blockcopolymer have alternating blocks of semi-crystalline, reinforcing segments and soft, elastomeric segments. Polyisobutylenes, such as Vistanex™ available from Exxon Chemical, Baton Rouge, La. are available in a range of molecular weights. Typically blends of high and low molecular polyisobutylenes are used, where the high molecular weight polymer provides the elastomeric properties and the low molecular weight polymers provide the more viscous properties and enhance the tackiness of the composition. High alkyl olefins include homopolymers and copolymers of high alkyl olefin monomers. High alkyl olefins include for example hexane and octene. If desired, they can be copolymerized with a smaller fraction of low alkyl olefin monomers, such as ethylene and propylene. Too high a content of low alkyl olefin may reduce adhesion and increase the modulus too much. Some of these polymers used metallocene type catalysts to carry out the polymerization. If desired, the olefin based assembly layer can covalently crosslinked and compounded with tackifiers to adjust modulus and tackiness. Typical tackifiers include hydrocarbon (i.e. known as C5, C9, or cyclopentadiene based) tackifiers, which can be hydrogenated. In some cases, the olefin may also be cohesively reinforced using inter-penetrating polymer networks. An example of this can be found in U.S. Pat. No. 8,232,350 (Bharti et al.).

Other materials can be added to the assembly layer composition for special purposes, including, for example: thermal or photoinitiators, cross-linkers, tackifiers, molecular weight control agents, coupling agent, oils, plasticizers, antioxidants, UV stabilizers, UV absorbers, pigments, catalysts, curing agents, polymer additives, nanoparticles, and other additives. In cases where the assembly layer needs to be optically clear, other materials can be added to the monomer mixture, provided that they do not significantly reduce the optical clarity of the assembly layer after polymerization and coating. As used herein, the term "optically clear" refers to a material that has a luminous transmission of greater than about 90 percent, a haze of less than about 2 percent, and opacity of less than about 1 percent in the 400 to 700 nm wavelength range. Both the luminous transmission and the haze can be determined using, for example, ASTM-D 1003-92. Typically, the optically clear assembly layer is visually free of bubbles.

In one embodiment, the assembly layer may be substantially free of acid to eliminate indium tin oxide (ITO) and metal trace corrosion that otherwise could damage touch sensors and their integrating circuits or connectors. "Substantially free" as used in this specification means less than about 2 parts by weight, particularly less than about 1 parts, and more particularly less than about 0.5 parts.

The assembly layer can be manufactured by any method known in the art depending on the particular components of the assembly layer. In one embodiment, the assembly layer components can be blended into a precursor mixture. This mixture is then coated on a liner or directly on a substrate and completely polymerized by additional exposure to heat or actinic irradiation.

In another process, the assembly layer components can be blended with a solvent to form a mixture. The mixture can be polymerized by exposure to heat or actinic radiation (to decompose initiators in the mixture). A cross-linker and additional additives such as tackifiers and plasticizers may be added to the solvated polymer which may then be coated on a liner and run through an oven to dry off solvent to yield the coated adhesive film. Solventless polymerization methods, such as the continuous free radical polymerization method described in U.S. Pat. Nos. 4,619,979 and 4,843,134 (Kotnour et al.); the essentially adiabatic polymerization methods using a batch reactor described in U.S. Pat. No. 5,637,646 (Ellis); and the methods described for polymerizing packaged pre-adhesive compositions described in U.S. Pat. No. 5,804,610 (Hamer et al.) may also be utilized to prepare the polymers.

In another process, the polymer for the assembly layer may be preformed. In such case the polymer may be dissolved in a suitable organic solvent, additives such a tackifier, a plasticizer, or if needed a crosslinker may be added. The solvated polymer mixture may then be coated on a liner and run through an oven to dry off solvent to yield the coated assembly layer.

The assembly layer composition can be coated onto a release liner, coated directly onto the carrier film, co-extruded with a flexible substrate film, or formed as a separate layer (e.g., coated onto a release liner) and then laminated to the flexible substrate. In some embodiments, the assembly layer is disposed between two release liners for subsequent lamination to the flexible substrate.

The disclosed compositions or precursor mixtures may be coated by any variety of techniques known to those of skill in the art, such as roll coating, spray coating, knife coating, die coating, and the like. Alternatively, the precursor composition may also be delivered as a liquid to fill the gap between the two substrates and subsequently be exposed to heat or UV to polymerize and cure the composition in between the two substrates.

The present invention also provides laminates including the assembly layer. A laminate is defined as a multi-layer composite of at least one assembly layer sandwiched between two flexible substrate layers or multiples thereof. For example the composite can be a 3 layer composite of substrate/assembly layer/substrate; a 5-layer composite of substrate/assembly layer/substrate/assembly layer/substrate, and so on. The thickness, mechanical, electrical (such as dielectric constant), and optical properties of each of the flexible assembly layers in such multi-layer stack may be the same but they can also be different in order to better fit the design and performance characteristics of the final flexible device assembly. The laminates have at least one of the following properties: optical transmissivity over a useful lifetime of the article in which it is used, the ability to maintain a sufficient bond strength between layers of the article in which it is used, resistance or avoidance of delamination, and resistance to bubbling over a useful lifetime. The resistance to bubble formation and retention of optical transmissivity can be evaluated using accelerated aging tests. In an accelerated aging test, the assembly layer is positioned between two substrates. The resulting laminate is then exposed to elevated temperatures often combined with elevated humidity for a period of time. Even after exposure to elevated temperature and humidity, the laminate, including the assembly layer, will retain optical clarity. For example, the assembly layer and laminate remain optically clear after aging at 70° C. and 90% relative humidity for approximately 72 hours and subsequently cooling to room temperature. After aging, the average transmission of the adhesive between 400 nanometers (nm) and 700 nm is greater than about 90% and the haze is less than about 5% and particularly less than about 2%.

In use, the assembly layer will resist fatigue over thousands or more of folding cycles over a broad temperature range from well below freezing (i.e., −30 degrees C., −20 degrees C., or −10 degrees C.) to about 70, 85 or even 90° C. In addition, because the display incorporating the assembly layer may be sitting static in the folded state for hours, the assembly layer has minimal to no creep, preventing significant deformation of the display, deformation which may be only partially recoverable, if at all. This permanent deformation of the assembly layer or the panel itself could lead to optical distortions or Mura, which is not acceptable in the display industry. Thus, the assembly layer is able to withstand considerable flexural stress induced by folding a display device as well as tolerating high temperature, high humidity (HTHH) testing conditions. Most importantly, the assembly layer has exceptionally low storage modulus and high elongation over a broad temperature range (including well below freezing; thus, low glass transition temperatures are preferred) and are cross-linked to produce an elastomer with little or no creep under static load.

During a folding or unfolding event, it is expected that the assembly layer will undergo significant deformation and cause stresses. The forces resistant to these stresses will be in part determined by the modulus and thickness of the layers of the folding display, including the assembly layer. To ensure a low resistance to folding as well as adequate performance, generation of minimal stress and good dissipation of the stresses involved in a bending event, the silicone-based assembly layer has a sufficiently low storage or elastic modulus, often characterized as shear storage modulus (G'). To further ensure that this behavior remains consistent over the expected use temperature range of such devices, there is minimal change in G' over a broad and relevant temperature range. In one embodiment, the relevant temperature range is between about −30° C. to about 90° C. In one embodiment, the shear modulus is less than about 2 MPa, particularly less than about 1 MPa, more particularly less than about 0.5 MPa, and most particularly less than about 0.3 MPa over the entire relevant temperature range. Therefore, it is preferred to position the glass transition temperature (Tg), the temperature at which the material transitions to a glassy state, with a corresponding change in G' to a value typically greater than about $10^7$ Pa, outside and below this relevant operating range. In one embodiment, the Tg of the assembly layer in a flexible display is less than about 10° C., particularly less than about −10° C., and more particularly less than about −30° C. As used herein, the term "glass transition temperature" or "Tg" refers to the temperature at which a polymeric material transitions from a glassy state (e.g., brittleness, stiffness, and rigidity) to a rubbery state (e.g., flexible and elastomeric). The Tg can be determined, for example, using a technique such as Dynamic Mechanical Analysis (DMA). In one embodiment, the Tg of the acrylic-based assembly layer in a flexible display is less than about 10° C., particularly less than about −10° C., and more particularly less than about −30° C.

The assembly layer is typically coated at a dry thickness of less than about 300 microns, particularly less than about 50 microns, particularly less than about 20 microns, more particularly less than about 10 microns, and most particularly less than about 5 microns. The thickness of the assembly layer may be optimized according to the position in the flexible display device. Reducing the thickness of the assembly layer may be preferred to decrease the overall thickness of the device as well as to minimize buckling, creep, or delamination failure of the composite structure.

The ability of the assembly layer to absorb the flexural stress and comply with the radically changing geometry of a bend or fold can be characterized by the ability of such a material to undergo high amounts of strain or elongation under relevant applied stresses. This compliant behavior can be probed through a number of methods, including a conventional tensile elongation test as well as a shear creep test. In one embodiment, in a shear creep test, the assembly layer exhibits a shear creep compliance (J) of at least about $6 \times 10^{-6}$/Pa, particularly at least about $20 \times 10^{-6}$/Pa, about $50 \times 10^{-6}$/Pa, and more particularly at least about $90 \times 10^{-6}$/Pa under an applied shear stress of between about 5 kPa to about 500 kPa, particularly between about 20 kPa to about 300 kPa, and more particularly between about 50 kPa to about 200 kPa. The test is normally conducted at room temperature but could also be conducted at any temperature relevant to the use of the flexible device.

The assembly layer also exhibits relatively low creep to avoid lasting deformations in the multilayer composite of a display following repeated folding or bending events. Material creep may be measured through a simple creep experiment in which a constant shear stress is applied to a material for a given amount of time. Once the stress is removed, the recovery of the induced strain is observed. In one embodiment, the shear strain recovery within 1 minute after removing the applied stress (at at least one point of applied shear stress within the range of about 5 kPa to about 500 kPa) at room temperature is at least about 50%, particularly at least about 60%, about 70% and about 80%, and more particularly at least about 90% of the peak strain observed at the application of the shear stress. The test is normally conducted at room temperature but could also be conducted at any temperature relevant to the use of the flexible device.

Additionally, the ability of the assembly layer to generate minimal stress and dissipate stress during a fold or bending event is critical to the ability of the assembly layer to avoid interlayer failure as well as its ability to protect the more fragile components of the flexible display assembly. Stress generation and dissipation may be measured using a traditional stress relaxation test in which a material is forced to and then held at a relevant shear strain amount. The amount of shear stress is then observed over time as the material is held at this target strain. In one embodiment, following about 500% shear strain, particularly about 600%, about 700%, and about 800%, and more particularly about 900% strain, the amount of residual stress (measured shear stress divided by peak shear stress) observed after 5 minutes is less than about 50%, particularly less than about 40%, about 30%, and about 20%, and more particularly less than about 10% of the peak stress. The test is normally conducted at room temperature but could also be conducted at any temperature relevant to the use of the flexible device.

As an assembly layer, the assembly layer must adhere sufficiently well to the adjacent layers within the display assembly to prevent delamination of the layers during the use of the device that includes repeated bending and folding actions. While the exact layers of the composite will be device specific, adhesion to a standard substrate such as PET may be used to gauge the general adhesive performance of the assembly layer in a traditional 180 degree peel test mode. The adhesive may also need sufficiently high cohesive strength, which can be measured, for example, as a laminate of the assembly layer material between two PET substrates in a traditional T-peel mode.

When the assembly layer is placed between two substrates to form a laminate and the laminate is folded or bent and held at a relevant radius of curvature, the laminate does not buckle or delaminate between all use temperatures (−30° C. to 90° C.), an event that would represent a material failure in a flexible display device. In one embodiment, a multilayer laminate containing the assembly layer does not exhibit failure when placed within a channel forcing a radius of curvature of less than about 200 mm, less than about 100 mm, less than about 50 mm, particularly less than about 20 mm, about 15 mm, about 10 mm, and about 5 mm, and more particularly less than about 2 mm over a period of about 24 hours. Furthermore, when removed from the channel and allowed to return from the bent orientation to its previously flat orientation, a laminate including the assembly layer of the present invention does not exhibit lasting deformation and rather rapidly returns to a flat or nearly flat orientation. In one embodiment, when held for 24 hours and then removed from the channel that holds the laminate with a radius of curvature of particularly less than about 50 mm, particularly less than about 20 mm, about 15 mm, about 10 mm, and about 5 mm, and more particularly less than about 3 mm, the composite returns to a nearly flat orientation where the final angle between the laminate, the laminate bend point and the return surface is less than about 50 degrees, more particularly less than about 40 degrees, about 30 degrees, and about 20 degrees, and more particularly less than about 10 degrees within 1 hour after the removal of the laminate from the channel. In other words, the included angle between the flat parts of the folded laminate goes from 0 degrees in the channel to an angle of at least about 130 degrees, particularly more than about 140 degrees, about 150 degrees, and about 160 degrees, and more particularly more than about 170 degrees within 1 hour after removal of the laminate from the channel. This return is preferably obtained under normal usage conditions, including after exposure to durability testing conditions.

In addition to the static fold testing behavior described above, the laminate including first and second substrates bonded with the assembly layer does not exhibit failures such as buckling or delamination during dynamic folding simulation tests. In one embodiment, the laminate does not exhibit a failure event between all use temperatures (−30° C. to 90° C.) over a dynamic folding test in free bend mode (i.e. no mandrel used) of greater than about 10,000 cycles, particularly greater than about 20,000 cycles, about 40,000 cycles, about 60,000 cycles, and about 80,000 cycles, and more particularly greater than about 100,000 cycles of folding with a radius of curvature of less than about 50 mm, particularly less than about 20 mm, about 15 mm, about 10 mm, and about 5 mm, and more particularly less than about 3 mm.

To form a flexible laminate, a first substrate is adhered to a second substrate by positioning the assembly layer of the present invention between the first substrate and the second substrate. Additional layers may also be included to make a multi-layer stack. Pressure and/or heat is then applied to form the flexible laminate.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following example are on a weight basis.

Test Method 1. Dynamic Mechanical Analysis

Dynamic mechanical analysis was used to probe the modulus as a function of temperature as well as to determine the glass transition temperature ($T_g$) of the material. An 8 mm diameter by about 1 mm thick disk of the assembly layer was placed between the probes of a DHR parallel plate rheometer (TA Instruments, New Castle, Del.). A temperature scan was performed by ramping from −45° C. to 50° C. at 3° C./min. During this ramp, the samples was oscillated at a frequency of 1 Hz and a strain of approximately 0.4%. The shear storage modulus (G') was recorded at selected key temperatures. The $T_g$ of the material was also determined as the peak in the tan delta vs. temperature profile. To ensure sufficient compliance of the assembly material over the typical range of use temperatures, it is preferred to have the shear storage modulus below about 2 MPa over the entire temperature range from about −20° C. to about 40° C. when measured using the test described above.

Test Method 2. Creep Test

The assembly layer samples were subjected to a creep test by placing a 8 mm diameter by about 1.0 mm thick disk in a DHR parallel plate rheometer and applying a shear stress of 95 kPa for 5 seconds at which time the applied stress was removed and the sample was allowed to recover in the fixtures for 60 seconds. The peak shear strain at 5 seconds and the amount of strain recovery after 60 seconds were recorded. The shear creep compliance, J, at any time following the application of the stress is defined as the ratio of the shear strain at that time divided by the applied stress. To ensure sufficient compliance within the assembly layer, it is preferred that the peak shear strain after applying the load in the test described above is greater than about 200%. Furthermore, to minimize material creep within the flexible assembly, it is preferred that the material recover greater that about 50% strain 60 seconds after the applied stress is removed. The percent recoverable strain is defined as (($S_1$−$S_2$)/$S_1$)*100 where $S_1$ is the shear strain recorded at the peak at 5 seconds after applying the stress and $S_2$ is the shear strain measured at 60 seconds after the applied stress is removed.

TABLE 1

| Materials | | |
| --- | --- | --- |
| Acronym | Name | Supplier |
| B 50 SF | Polyisobutylene | BASF Corporation, Florham Park, NJ |
| SR833 S | Tricyclodecane trimethanol diacrylate | Sartomer, Exton, PA |
| Escorez 5300 | Cycloaliphatic hydrocarbon resin | Exxonmobil, Houston, TX |
| TPO-L | 2,4,6-trimehylbenzoylphenyl phosphinate | BASF Corporation, Florham Park, NJ |
| Heptane | Heptane | EMD Millipore Corporation, Billerica, MA |
| IPDI | Isophorone diisocyanate/Desmodur I | Bayer Corp., Pittsburgh, PA, USA |
| TMDI | Mixture of 2,2,4-trimethyl-1,6-diisocyanatohexane and 2,4,4-trimethyl-1,6-diisocyanatohexane | Evonik, Parsippany, NJ, USA |
| Silicone diol 1 | dimethylsiloxane dicarbinol, 1732 MW/5562 CarbinolFluid | Dow Corning, Midland, MI |
| Silicone diol 2 | dimethylsiloxane dicarbinol, 3650 MW/DMS-C21 | Gelest Morrisville, PA |
| DMPA | 2,2-dimethylol propionic acid/CAS number 4767-03-7 | Sigma-Aldrich Co., St. Louis, MO |

TABLE 1-continued

Materials

| Acronym | Name | Supplier |
| --- | --- | --- |
| DBTDA | Dibutyl tin diacetate/CAS number 1067-33-0 | Sigma-Aldrich Co., St. Louis, MO |
| BD | 1,4-butanediol | Sigma-Aldrich Co., St. Louis, MO |
| E1 | Esacure One photoinitiator Oligo[2-hydroxy-2-methyl-1-[4-(1-methylvinyl)phenyl]propanone | Lamberti SPA, Gallerate, Italy |
| EAD | Epoxy Acrylate diol Denacol DA-920, polypropylene glycol (3) diglycidyl ether reacted with acrylic acid | Nagase America, New York, NY |
| PET Release Liner | Siliconature SILPHAN S50 on 50 micron thick PET | Siliconature USA, Chicago, IL |
| TEA | triethylamine | Sigma-Aldrich Co., St. Louis, MO |
| PAX | Polyaziridine crosslinker PZ-28, EW 167, CAS 64265-57-2 | Polyaziridine LLC, Medford, NJ |

Preparation of Silicone Polyurethane 1

A 250 mL roundbottom was charged with 8.41 g IPDI (0.075644 eq), 40.80 g silicone diol1 (0.047277 eq), 0.79 g DMPA (0.011819 eq), 12.74 g MEK, and 3 drops (~0.06 g) DBTDA, placed in an oil bath and heated to 80 C. After 7 h at reaction temperature, the reaction was allowed to cool to RT overnight. The reaction was diluted with 58 g MEK and about half of the solution of 0.96 g BD (0.080371 eq) in 2 g MEK was added as the reaction was heated to 85 C internal temperature. After 30 min the remainder of the BD was added and rinsed in with about a gram of MEK. The reaction was monitored by FTIR and at the end of 7 h a small —NCO peak was still noted at 2265 cm$^{-1}$. To the reaction was added 0.20 g of a 10% by weight solution of BD in MEK solution, and reaction was continued for 3 h at 78 C. Some solvent was lost and the reaction was diluted to 50% solids with MEK.

Preparation of Comparative Example 1

A 50 mL jar was charged with the materials indicated in Table 2 and shaken for a few seconds. The solution was coated using a 0.762 mm drawdown bar onto a PET Release Liner and dried overnight at RT to a nominal dried thickness of about 0.25 mm. The coating was placed in an oven at 80 C for 20 min. The coating was then laminated against itself. The resultant two thickness laminate was then cut in half and laminated against itself again. The ~1 mm laminate was used for further testing.

TABLE 2

| Adhesive Assembly | Polyurethane 1A 50% in MEK | Triethylamine 50% in MEK | PAX 20% in MEK | Percentage of acid groups reacted |
| --- | --- | --- | --- | --- |
| CE1 | 10 g | 0.117 | 0.121 | 12.5 |

Preparation of Silicone Polyurethane 2

A 250 mL roundbottom was charged with 10.23 g TMDI (0.075644 eq), 52.53 g silicone diol1 (0.060863 eq), 0.98 g DMPA (0.014607 eq), 16.25 g MEK, and 3 drops (~0.06 g) DBTDA, placed in an oil bath and heated to 80 C. After 3 h at reaction temperature, an FTIR was taken of the reaction showing a peak at 2265 cm$^{-1}$. The reaction at 3 h 10 min was diluted with 48.75 g MEK and about half of the solution of 1.26 g BD (0.027997 eq) in 2 g MEK was added. At 3 h 30 min the remainder of the BD was added and rinsed in with about a gram of MEK. The reaction was heated for 12 h more at 80 C, and then monitored by FTIR showing no —NCO peak 2265 cm$^{-1}$. The reaction was adjusted to 50% solids with MEK.

Preparation of Examples 1 and 2 and Comparative Example 2

For each of the samples, a 50 mL jar was charged with the materials indicated in Table 3 and shaken for a few seconds. The ~1 mm laminates were prepared as described in Preparation of Comparative Example 1.

TABLE 3

| Adhesive Assembly | Polyurethane 2 50% in MEK | Triethylamine 50% in MEK | PAX 10% in MEK | Percentage of acid groups reacted |
| --- | --- | --- | --- | --- |
| CE2 | 10 g | 0.117 | 0.121 | 12.5 |
| Ex1 | 10 g | 0.117 | 0.242 | 25 |
| Ex2 | 10 g | 0.117 | 0.484 | 50 |

Preparation of Silicone Polyurethane 3

A 250 mL roundbottom was charged with 9.34 g TMDI (0.084028 eq), 40.79 g silicone diol1 (0.047266 eq), 13.13 g Silicone diol 2 (0.007195 eq), 0.98 g DMPA (0.014607 eq), 16.25 g MEK, and 3 drops (~0.06 g) DBTDA, placed in an oil bath and heated to 80 C. After 3 h at reaction temperature, an FTIR was taken of the reaction showing a peak at 2265 cm'. The reaction at 3 h 10 min was diluted with 48.75 g MEK and about half of the solution of 0.76 g BD (0.016911 eq) in 2 g MEK was added. At 3 h 10 min the remainder of the BD was added and rinsed in with about a gram of MEK. The reaction was heated for 16 h more at 80 C, and then monitored by FTIR showing a small —NCO peak 2265 cm$^{-1}$. To the reaction was added 0.45 g of a 10% by weight solution of BD in MEK, 0.045 g solids (0.001 eq). After 4 h after the 0.045 g BD addition, a very small —NCO peak remained at 2265 cm$^{-1}$, and 0.28 g of a 10% by weight solution of BD in MEK, 0.028 g solids (0.00062 eq) was added. After 2 h the —NCO peak at 2265 cm$^{-1}$ was insignificant. The reaction was adjusted to 50% solids with MEK.

Preparation of Examples 3-5

For each of the samples, a 50 mL jar was charged with the materials indicated in Table 4 and shaken for a few seconds. The ~1 mm laminates were prepared as described in Preparation of Comparative Example 1.

TABLE 4

| Adhesive Assembly | Polyurethane 3 50% in MEK | Triethylamine 50% in MEK | PAX 10% in MEK | Percentage of acid groups reacted |
|---|---|---|---|---|
| Ex3 | 10 g | 0.113 | 0.59 | 6.25 |
| Ex4 | 10 g | 0.113 | 0.117 | 12.5 |
| Ex5 | 10 g | 0.113 | 0.234 | 25 |

Preparation of Silicone Polyurethane 4

A 250 mL roundbottom was charged with 10.69 g IPDI (0.096146 eq), 0.78 g EAD (0.00361 eq), 16.25 g MEK, and 3 drops (~0.06 g) DBTDA, placed in an oil bath and heated to 75 C for 30 min. Next 51.86 g silicone diol 1 (0.06009 eq), and 0.97 g DMPA (0.01442 eq) were added and reacted for 3 h. The reaction was then analyzed by FTIR, showing a small —NCO peak at 2265 cm'. To the reaction was added 48.75 g MEK followed by 0.71 g BD (0.015744). The reaction was allowed to proceed for 12 h at 75 C. At the end of this time the reaction showed no —NCO peak. The solids were adjusted to 50% solids with MEK.

Preparation of Silicone Polyurethane 5

In a manner similar to that of the Preparation of Polyurethane 4, 9.25 g IPDI (0.08323 eq), 0.78 g EAD (0.00361 eq), 3 drops (~0.06 g) DBTDA in 16.25 g MEK were reacted for 30 min at 75 C followed by addition of 40.40 g silicone diol 1 (0.046817 eq), 13.00 g silicone diol 2 (0.07127 eq), and 0.97 g DMPA (0.0144 eq) and reaction for 3 h. The reaction was then diluted with 48.75 g MEK and 0.59 g BD (0.01314 eq) was added followed by reaction for 12 h, and adjustment of solids to 50% with MEK to provide Silicone Polyurethane 5.

Preparation of Example 6 and Comparative Example 3

To Polyurethane 4, 10.0 g solution at 50% solids, was added 0.50 g of a 10% solution of Esacure KB1. Similarly, to Polyurethane 5, 10.0 g solution at 50% solids, was added 0.50 g of a 10% solution of Esacure One. Each solution was coated as described in Preparation of Comparative Example 1. The coatings were dried overnight at RT, then in an oven for 5 min at 80 C. Each coating was then cured using a nitrogen purged Fusion Systems device with a 300 watt Fusion D bulb (Fusion Systems, Inc., Gaithersburg, Md.) at a conveyer speed of 9.14 m/min. From this point, the ~1 mm laminates were prepared as described in Preparation of Comparative Example 1. See Table 5.

TABLE 5

| Adhesive Assembly | Polyurethane |
|---|---|
| CE3 | 4 |
| Ex6 | 5 |

Examples 7 and 8: Preparation of Polyisobutylene-Based Assembly Layer Samples

Assembly layer films were prepared according the compositions provided in Table 6. In Example 7, 5.876 g of B 50 SF, 0.293 g of SR 833 S, 0.029 g of TPO-L, and 12.011 g of heptane were added in a glass vial. The vial was sealed and contents were mixed overnight. The solution was then coated on a 50 μm thick siliconized polyester release liner, RF02N (SKC Haas, Korea) using a knife coater with a gap of 8 mil. The coated sample was placed in an oven at 70° C. for 15 minutes. This coated sample was then irradiated with an H-bulb with a total dose of 1200 mJ/cm$^2$ of UV-A. In Example 8, 8.333 g of B 50 SF, 0.416 g of Escorez 5300, and 16.667 g of heptane were added in a glass vial. The vial was sealed and contents were mixed overnight. The solution was then coated on a 50 μm thick siliconized polyester release liner, RF02N (SKC Haas, Korea) using a knife coater with a gap of 8 mil. The coated sample was placed in an oven at 70° C. for 15 minutes. In comparative example 4 (CE4), 6 g and 12.011 g of heptane were added in a glass vial. The vial was sealed and contents were mixed overnight. The solution was then coated on a 50 μm thick siliconized polyester release liner, RFO2N (SKC Haas, Korea) using a knife coater with a gap of 8 mil. The coated sample was placed in an oven at 70° C. for 15 minutes.

TABLE 6

Preparation of Polyisobutylene-based assembly layer samples

| Example | B 50 SF (g) | SR833 S (g) | Escorez 5300 (g) | TPO-L (g) | Heptane |
|---|---|---|---|---|---|
| CE4 | 6 | | | | 12.011 |
| Ex7 | 5.876 | 0.293 | | 0.029 | 11.733 |
| Ex8 | 8.333 | | 0.416 | | 16.667 |

Examples 7-8 and Comparative Examples CE4 were tested for $T_g$, shear creep, shear modulus and shear stress as described in Test Methods 2-3 described above. Data are recorded in Table 7 below.

TABLE 7

Rheological data

| Example | $T_g$ ° C. | Shear Modulus G' | | | | Shear Creep | |
|---|---|---|---|---|---|---|---|
| | | 40° C. kPa | 20° C. kPa | 0° C. kPa | -20° C. kPa | Strain @ 95 kPa Stress % | R Recovery @ 60 s % |
| CE1 | NT | 21.9 | 93.3 | 473.7 | 2440.9 | 732 | 71.5 |
| CE2 | NT | 4.5 | 9.7 | 29.4 | 114.4 | 3737 | 8.5 |
| CE3 | NT | 34.8 | 138.8 | 593.1 | 2447.6 | 440 | 81.4 |
| Ex1 | NT | 10.1 | 15.8 | 38.0 | 117.4 | 791 | 94.8 |
| Ex2 | NT | 23.8 | 30.9 | 62.4 | 151.7 | 350 | 95.9 |
| Ex3 | NT | 21.6 | 93.4 | 383.1 | 1516.1 | 907 | 63.5 |
| Ex4 | NT | 27.9 | 96.2 | 363.0 | 1296.0 | 649 | 83.8 |
| Ex5 | NT | 39.3 | 108.4 | 363.9 | 1187.3 | 316 | 96.8 |
| Ex6 | NT | 15.7 | 69.2 | 302.5 | 1206.8 | 723 | 79.2 |
| CE4 | -42 | 246.2 | 272.1 | 301.9 | 485.4 | 848 | 43.2 |
| Ex7 | -41 | 240.7 | 285.3 | 340.7 | 583.6 | 189 | 90.3 |
| Ex8 | -40 | 218.1 | 246.5 | 286.9 | 528.9 | 257 | 71.8 |

NT: Not Tested

Although the present invention has been described with reference to preferred embodiments, workers skilled in the art will recognize that changes may be made in form and detail without departing from the spirit and scope of the invention.

What is claimed is:

1. An assembly layer for a flexible device comprising:
an adhesive composition, wherein within a temperature range of between about −30° C. to about 90° C., the assembly layer has a shear storage modulus at a frequency of 1 Hz that does not exceed about 2 MPa, a shear creep compliance (J) of at least about $6 \times 10^{-6}$ 1/Pa measured at 5 seconds with an applied shear stress between about 50 kPa and about 500 kPa, and a strain recovery of at least about 50% at at least one point of applied shear stress within the range of about 5 kPa to about 500 kPa within about 1 minute after removing the applied shear stress,
wherein the assembly layer comprises a urethane-based silicone copolymer, wherein the urethane-based silicone copolymer comprises units of the following formulas:

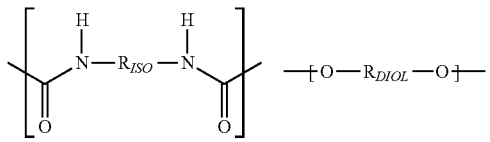

wherein $R_{ISO}$ is the residue of a diisocyanate and $R_{DIOL}$ is the residue of a diol,
wherein $R_{DIOL}$ comprises units of the formula,
a) —$R_2$—,
   wherein $R_2$ is a straight, branched chain, or cyclic alkylene or oxyalkylene,
b) silicone-based units of the formula -Q-$(R_1)_2$SiO—(Si$(R_1)_2$O)$_n$—Si$(R_1)_2$-Q-,
   wherein $R_1$ is independently alkyl or aryl and wherein Q is a connecting group of valency 2 or greater, and n=5-200,
   and at least one of the units c), d), e), and f) wherein
c) acrylate containing units of the formula —$R_2$-(A)$_b$-Q-(A)$_b$-$R_2$—,
   and A is a (meth)acryl functional group X—C(O)C($R_4$)=CH$_2$,
   wherein X is selected from O— or NR$_3$,
   wherein $R_3$ is H or alkyl of 1-4 carbon atoms,
   wherein $R_4$ is alkyl of 1-4 carbon atoms, and
   wherein b is 1-3, and Q and $R_2$ are defined as above,
d) carboxylic acid containing units of the formula —$R_2$—O—(CO$_2$H)$_b$—$R_2$—, wherein —$R_2$—, b, and Q, are defined as above and
e) sulfonate acid salt containing units of the formula —$R_2$-Q-(SO$_3$M)$_b$-$R_2$—, wherein —$R_2$—, b, and Q, are defined as above and M is Na or Li,
f) quaternary ammonium salts units of the formula —$R_2$-Q-(N($R_5$)$_3$+X—)$_b$—$R_2$—, wherein —$R_2$—, b, and Q, are defined as above and $R_5$ is independently alkyl, aryl, aralkyl, alkaryl, alkylene, arylene, aralkylene, or alkarylene, and X— is a counterion.

2. The assembly layer of claim 1, wherein the assembly layer is optically clear.

3. The assembly layer of claim 1, wherein the flexible device is an electronic display device.

4. The assembly layer of claim 1, wherein the assembly layer has a glass transition temperature of up to about 10° C.

5. A laminate comprising:
a first flexible substrate;
a second flexible substrate; and
an assembly layer positioned between and in contact with the first flexible substrate and the second flexible substrate, wherein within a temperature range of between about −30° C. to about 90° C., the assembly layer has a shear storage modulus at a frequency of 1 Hz that does not exceed about 2 MPa, a shear creep compliance (J) of at least about $6 \times 10^{-6}$ 1/Pa measured at 5 seconds with an applied shear stress between about 50 kPa and about 500 kPa, and a strain recovery of at least about 50% at at least one point of applied shear stress within the range of about 5 kPa to about 500 kPa within about 1 minute after removing the applied shear stress,
wherein the assembly layer comprises a urethane-based silicone copolymer, wherein the urethane-based silicone copolymer comprises units of the following formulas:

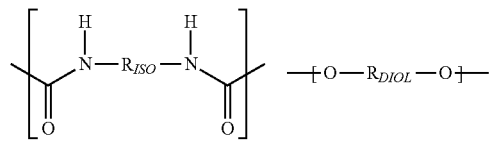

wherein $R_{ISO}$ is the residue of a diisocyanate and $R_{DIOL}$ is the residue of a diol,
wherein $R_{DIOL}$ comprises units of the formula,
a) —$R_2$—,
   wherein $R_2$ is a straight, branched chain, or cyclic alkylene or oxyalkylene,
b) silicone-based units of the formula -Q-$(R_1)_2$SiO—(Si$(R_1)_2$O)$_n$—Si$(R_1)_2$-Q-,
   wherein $R_1$ is independently alkyl or aryl and wherein Q is a connecting group of valency 2 or greater, and n=5-200,
   and at least one of the units c), d), e), and f) wherein
c) acrylate containing units of the formula —$R_2$-(A)$_b$-Q-(A)$_b$-$R_2$—,
   and A is a (meth)acryl functional group X—C(O)C($R_4$)=CH$_2$,
   wherein X is selected from O— or NR$_3$,
   wherein $R_3$ is H or alkyl of 1-4 carbon atoms,
   wherein $R_4$ is alkyl of 1-4 carbon atoms, and
   wherein b is 1-3, and Q and $R_2$ are defined as above,
d) carboxylic acid containing units of the formula —$R_2$—O—(CO$_2$H)$_b$—$R_2$—, wherein —$R_2$—, b, and Q, are defined as above and
e) sulfonate acid salt containing units of the formula —$R_2$-Q-(SO$_3$M)$_b$-$R_2$—, wherein —$R_2$—, b, and Q, are defined as above and M is Na or Li,
f) quaternary ammonium salts units of the formula —$R_2$-Q-(N($R_5$)$_3$+X—)$_b$—$R_2$—, wherein —$R_2$—, b, and Q, are defined as above and $R_5$ is independently alkyl, aryl, aralkyl, alkaryl, alkylene, arylene, aralkylene, or alkarylene, and X— is a counterion.

6. The laminate of claim 5, wherein the assembly layer is optically clear.

7. The laminate of claim 5, wherein the laminate has a haze value of less than about 5% after the laminate is placed in an environment of 70° C./90% relative humidity for 72 hours and then cooled to room temperature.

8. The laminate of claim 5, wherein the assembly layer has a glass transition temperature of up to about 10° C.

9. The laminate of claim 5, wherein the laminate does not exhibit failure when placed within a channel forcing a radius of curvature of less than about 15 mm over a period of 24 hours at room temperature.

10. The laminate of claim 9, wherein the laminate returns to an included angle of at least about 130 degrees after removal from the channel after the 24 hour period at room temperature.

11. The laminate of claim 5, wherein the laminate does not exhibit failure when subjected to a dynamic folding test at room temperature of about 10,000 cycles of folding with a radius of curvature of less than about 15 mm.

12. A method of adhering a first substrate and a second substrate, wherein both of the first and the second substrates are flexible, the method comprising:
positioning an assembly layer between the first flexible substrate and the second flexible substrate to form a laminate, wherein within a temperature range of between about −30° C. to about 90° C., the assembly layer has a shear storage modulus at a frequency of 1 Hz that does not exceed about 2 MPa, a shear creep compliance (J) of at least about $6\times10^{-6}$ 1/Pa measured at 5 seconds with an applied shear stress between about 50 kPa and about 500 kPa, and a strain recovery of at least about 50% at at least one point of applied shear stress within the range of about 5 kPa to about 500 kPa within about 1 minute after removing the applied shear stress, wherein the assembly layer comprises a urethane-based silicone copolymer, wherein the urethane-based silicone copolymer comprises units of the following formulas:

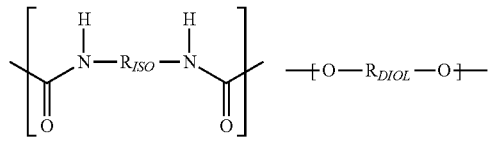

wherein $R_{ISO}$ is the residue of a diisocyanate and $R_{DIOL}$ is the residue of a diol,
wherein $R_{DIOL}$ comprises units of the formula,
a) —$R_2$—,
wherein $R_2$ is a straight, branched chain, or cyclic alkylene or oxyalkylene, b) silicone-based units of the formula -Q-$(R_1)_2$SiO—(Si$(R_1)_2$O$)_n$—Si$(R_1)_2$-Q-,
wherein $R_1$ is independently alkyl or aryl and wherein Q is a connecting group of valency 2 or greater, and n=5-200,
and at least one of the units c), d), e), and f) wherein
c) acrylate containing units of the formula —$R_2$-(A)$_b$-Q-(A)$_b$-$R_2$—,
and A is a (meth)acryl functional group X—C(O)C($R_4$)=CH$_2$,
wherein X is selected from O— or NR$_3$,
wherein $R_3$ is H or alkyl of 1-4 carbon atoms,
wherein $R_4$ is alkyl of 1-4 carbon atoms, and
wherein b is 1-3, and Q and $R_2$ are defined as above,
d) carboxylic acid containing units of the formula —$R_2$—O—(CO$_2$H)$_b$—$R_2$—, wherein —$R_2$—, b, and Q, are defined as above and
e) sulfonate acid salt containing units of the formula —$R_2$-Q-(SO$_3$M)$_b$-$R_2$—, wherein —$R_2$—, b, and Q are defined as above and M is Na or Li,
f) quaternary ammonium salts units of the formula —$R_2$-Q-(N($R_5$)$_3$+X—)$_b$—$R_2$—, wherein —$R_2$—, b, and Q, are defined as above and $R_5$ is independently alkyl, aryl, aralkyl, alkaryl, alkylene, arylene, aralkylene, or alkarylene, and X— is a counterion in; and
applying at least one of pressure and heat to form a laminate.

13. The method of claim 12, wherein the assembly layer is optically clear.

14. The method of claim 12, wherein the laminate does not exhibit failure when placed within a channel forcing a radius of curvature of less than about 15 mm over a period of 24 hours at room temperature.

15. The method of claim 14, wherein the laminate returns to an included angle of at least about 130 degrees after removal from the channel after the 24 hour period at room temperature.

16. The method of claim 12, wherein the laminate does not exhibit failure when subjected to a dynamic folding test at room temperature of greater than about 10,000 cycles of folding with a radius of curvature of less than about 15 mm.

* * * * *

UNITED STATES PATENT AND TRADEMARK OFFICE
CERTIFICATE OF CORRECTION

PATENT NO. : 10,752,810 B2
APPLICATION NO. : 15/575680
DATED : August 25, 2020
INVENTOR(S) : Belma Haug et al.

It is certified that error appears in the above-identified patent and that said Letters Patent is hereby corrected as shown below:

On the Title Page

Column 2
Line 2, Delete "Compa" and insert -- Company --, therefor.

In the Specification

Column 2
Line 11, Delete "$6\times10^{-6}/Pa$" and insert -- $6\times10^{-6}\ 1/Pa$ --, therefor.

Column 2
Line 25, Delete "$6\times10^{-6}/Pa$" and insert -- $6\times10^{-6}\ 1/Pa$ --, therefor.

Column 2
Line 40, Delete "$6\times10^{-6}/Pa$" and insert -- $6\times10^{-6}\ 1/Pa$ --, therefor.

Column 5
Line 56, Delete "diiisocyanate" and insert -- diisocyanate --, therefor.

Column 5
Line 57, Delete "diiisocyanate" and insert -- diisocyanate --, therefor.

Column 9
Line 58, Delete "$6\times10^{-6}/Pa$," and insert -- $6\times10^{-6}\ 1/Pa$, --, therefor.

Column 9
Line 58, Delete "$20\times10^{-6}/Pa$," and insert -- $20\times10^{-6}\ 1/Pa$, --, therefor.

Column 9
Line 59, Delete "$50\times10^{-6}/Pa$," and insert -- $50\times10^{-6}\ 1/Pa$, --, therefor.

Signed and Sealed this
Twelfth Day of July, 2022

Katherine Kelly Vidal
*Director of the United States Patent and Trademark Office*

Column 9
Line 59, Delete "90×10⁻⁶/Pa," and insert -- $90 \times 10^{-6}$ 1/Pa, --, therefor.

Column 12
Line 52 (approx.), Delete "trimehylbenzoylphenyl" and insert -- trimethylbenzoylphenyl --, therefor.

Column 13
Line 8 (approx.), Delete "Gallerate," and insert -- Gallarate, --, therefor.

In the Claims

Column 17
Line 10, In Claim 1, delete "6×10⁻⁶1/Pa" and insert -- $6 \times 10^{-6}$ 1/Pa --, therefor.

Column 17
Line 46, In Claim 1, delete "O—" and insert -- O—, --, therefor.

Column 17
Line 51, In Claim 1, delete "O—" and insert -- Q— --, therefor.

Column 18
Line 11, In Claim 5, delete "6×10⁻⁶1/Pa" and insert -- $6 \times 10^{-6}$ 1/Pa --, therefor.

Column 18
Line 45, In Claim 5, delete "O—" and insert -- O—, --, therefor.

Column 18
Line 50, In Claim 5, delete "O—" and insert -- Q— --, therefor.

Column 19
Line 22, In Claim 12, delete "6×10⁻⁶1/Pa" and insert -- $6 \times 10^{-6}$ 1/Pa --, therefor.

Column 20
Line 11, In Claim 12, delete "O—" and insert -- O—, --, therefor.

Column 20
Line 17, In Claim 12, delete "O—" and insert -- Q— --, therefor.